US008320584B2

(12) United States Patent
Sheets

(10) Patent No.: US 8,320,584 B2
(45) Date of Patent: Nov. 27, 2012

(54) METHOD AND SYSTEM FOR PERFORMING AUDIO SIGNAL PROCESSING

(76) Inventor: Laurence L. Sheets, Moulton, IA (US)

( * ) Notice: Subject to any disclaimer, the term of this patent is extended or adjusted under 35 U.S.C. 154(b) by 1021 days.

(21) Appl. No.: 12/331,905

(22) Filed: Dec. 10, 2008

(65) Prior Publication Data

US 2010/0145486 A1 Jun. 10, 2010

(51) Int. Cl.

| | |
|---|---|
| ***H04R 1/40*** | (2006.01) |
| ***H04B 1/00*** | (2006.01) |
| ***H03G 3/00*** | (2006.01) |
| ***G06F 17/00*** | (2006.01) |

(52) U.S. Cl. ............... 381/97; 381/61; 381/119; 700/94

(58) Field of Classification Search .................... 700/94; 381/97, 119, 61, 92, 356

See application file for complete search history.

(56) References Cited

U.S. PATENT DOCUMENTS

| | | | | |
|---|---|---|---|---|
| 3,557,347 | A * | 1/1971 | Robertson | 708/9 |
| 3,856,992 | A | 12/1974 | Cooper | |
| 3,906,156 | A | 9/1975 | Cooper | |
| 3,970,788 | A | 7/1976 | Cooper | |
| 4,218,585 | A | 8/1980 | Carver | |
| 4,236,039 | A | 11/1980 | Cooper | |
| 4,857,777 | A * | 8/1989 | Altes | 327/255 |
| 5,454,041 | A | 9/1995 | Davis | |
| 5,677,957 | A | 10/1997 | Hulsebus | |
| 6,760,451 | B1 * | 7/2004 | Craven et al. | 381/98 |
| 7,020,290 | B1 | 3/2006 | Ribic | |
| 2006/0072768 | A1 | 4/2006 | Schwartz et al. | |

OTHER PUBLICATIONS

Little Labs, "IBP Analog Phase Alignment Tool", Oct. 2002, Little Labs, All pages.*

* cited by examiner

*Primary Examiner* — Jesse Elbin

(74) *Attorney, Agent, or Firm* — McDonnell Boehnen Hulbert & Berghoff LLP

(57) ABSTRACT

A method and system for performing audio signal processing is provided. A phase of a signal may be shifted between 0° and 360° for all frequencies of the signal, without any significant delay distortion. The phase shift can be accomplished through the use of two signal outputs (which are each shifted in phase by 90° relative to the other), inverters and an analog summing circuit. Selective use of the inverter on one or both of the 90° phase shifted outputs, and their linear combinations, allows the phase of the audio signal outputs to be shifted between about 0° and about 360° by a recording engineer, for example.

24 Claims, 9 Drawing Sheets

METHOD AND SYSTEM FOR PERFORMING AUDIO SIGNAL PROCESSING

FIELD

The present application relates to audio signal processing, and more particularly to adjusting phases of audio signals and combining multiple audio signals in an additive fashion.

BACKGROUND

Audio mixing is a process by which a multitude of sound sources are combined into one or more signals. Signals from the sources might be live or recorded and could be generated from different musical instruments, vocals, orchestra sections, announcers or crowd noise. A source signal's amplitude, frequency content, dynamics and panoramic position can be manipulated during mixing to add effects, such as reverberation, for example.

Recording studios make use of multiple microphones to record a single event. Microphones may be placed above and below drums, as well as in front and in back of drums, for example. The same may be true of other musical instruments as well as for vocalists. Resulting electrical signals from the microphones are then combined in artistic, as well as technical methods, so as to produce an elevated mix that is more appealing to listeners.

In one example, a microphone may be placed near a North side of the drum membrane, and another may be placed near a South side of the drum membrane. When the drum makes a sound, the top microphone will receive sound waves of a reference phase, and the bottom microphone will receive sound waves 180° out of phase from the reference phase. This follows because when the diaphragm of the drum is swinging toward the North side, the diaphragm is simultaneously swinging away from the South side. Thus, a signal received by the top microphone will be nearly 180° out of phase with a signal received by the bottom microphone. If the signals from the two microphones are added together, the signals will largely cancel each other out, which is not acceptable. Thus, one common solution is to invert the signal from the bottom microphone by 180° before the signal is added to (or "mixed with") the signal from the top microphone. Alternatively, the signal from the bottom signal may be delayed with respect to the signal of the top microphone before the signals are combined. If there were also microphones placed near an East and/or West side of the drum, it can become more difficult to combine all of the signals so that the signals do not cancel portions of each other out.

SUMMARY

A system is described, substantially as shown in and or described in connection with at least one of the figures, as set forth more completely in the claims, which provides a manner for performing audio signal processing.

In one application, it is desirable to install two different microphones to pick up sound from a guitar, for example. One microphone may be placed close to the guitar to pick up direct sound, and another microphone may be placed farther away to pick up sound around an area in which the guitar is being played. Both sounds are captured; however, signals output from the two microphones may compete with each other and can cancel portions of each other when combined.

Generally, if both microphones are perfectly separated from one another, an incoming volume level will be at its maximum, and the signals will add in phase to receive a maximum power level. Thus, if the two signals are aligned in phase, the amplitudes of the two signals would add fully. If one signal was out of phase in a parallel fashion with the other signal, a "phase reverse" can be implemented to introduce a 180° phase shift into one signal so that the signals can be added together in phase. However, it is not always the case that one signal is 180° out of phase with the other signal. Thus, it is desirable to be able to adjust a signal anywhere between 0° or about 0° and 360° or about 360° so that a signal may be finely adjusted to be in phase with the other signal, so that the two signals can be combined to receive a maximum potential output of both microphones. Simply introducing a time delay into one of the signals would only adjust the signal for one frequency. However, performing a phase shift of the signal can apply to all frequencies of the signal.

Within embodiments of the present application, a phase of an audio signal may be shifted between 0° and 360° without any significant delay distortion. For example, all signals from a microphone placed near a bottom of a drum could be phase-shifted 160° (or any other amount) from signals output of a microphone placed near a top of the drum. The same phase can be applied for substantially all frequencies at a particular microphone without substantial delay distortion. The phase shift can be accomplished through the use of two audio signal outputs (which are each shifted in phase so that the signals are 90° apart from each other in phase), plus inverters and an analog summing circuit. The selective use of the inverters on one or both of the phase shifted outputs, and applying their linear combination, allows the phase of the audio signal outputs to be shifted between about 0° and about 360° degrees by a recording engineer.

In one embodiment, a system is provided that allows for a phase of the audio signal to be shifted from about 0° to about 360°. The system includes a delay equalization filter for receiving an audio signal and introducing a compensating delay into the audio signal, and a Hilbert transform filter-pair for receiving the audio signal from the delay equalization filter and outputting two signal components that are about 90° apart from each other in phase. The system further includes one or more inverters for inverting one or both of the two signal components, and a summing circuit for performing linear combinations of two signals selected from the group of the two signal components or compliments of the two signal components so as to allow for a phase of the audio signal to be shifted from about 0° to about 360°.

In another embodiment, a method of adjusting a phase of an audio signal is provided that includes receiving an audio signal, receiving an input from a user that is used to determine a phase shift to a phase of the audio signal to achieve a desired degree of loudness of the audio signal, and allowing for adjustment of the phase of the audio signal from about 0° to about 360°. The method may further include splitting the audio signal into a first signal and a second signal such that a phase of the first signal is about 90° apart from a phase of the second signal by performing a Hilbert Transform of the audio signal. The method may allow for adjustment of the phase of the audio signal from about 0° to about 360° by providing a way to linearly combine the first signal and the second signal resulting in an output signal that has a phase that is shifted from the phase of the audio signal by the determined phase shift.

These and other features and advantages may be appreciated from a review of the following detailed description, along with the accompanying figures.

DETAILED DESCRIPTION

The present application provides a system and method for combining phase shifted audio signals together as one signal. Using the present system, many microphones may record audio signals from all areas of a room, for example, and the signals may be combined to produce a full audio signal. Each microphone may include a control to allow a phase shift of the audio signal between 0° or about 0° and 360° or about 360°, and a user may manually adjust the phase shift of the signal until a degree of loudness of the signal is achieved (e.g., until a desired volume of the signal is reached). Using the present system and method, a user may adjust the microphones so as to receive a signal from each microphone of substantially equal volume to receive what is considered a full sound from all microphones from all areas of a room, for example. Thus, signals from the microphones may be adjusted to be substantially in phase for all frequencies, and the signals from all of the microphones may then be combined to create a resulting audio signal.

Figure 1:
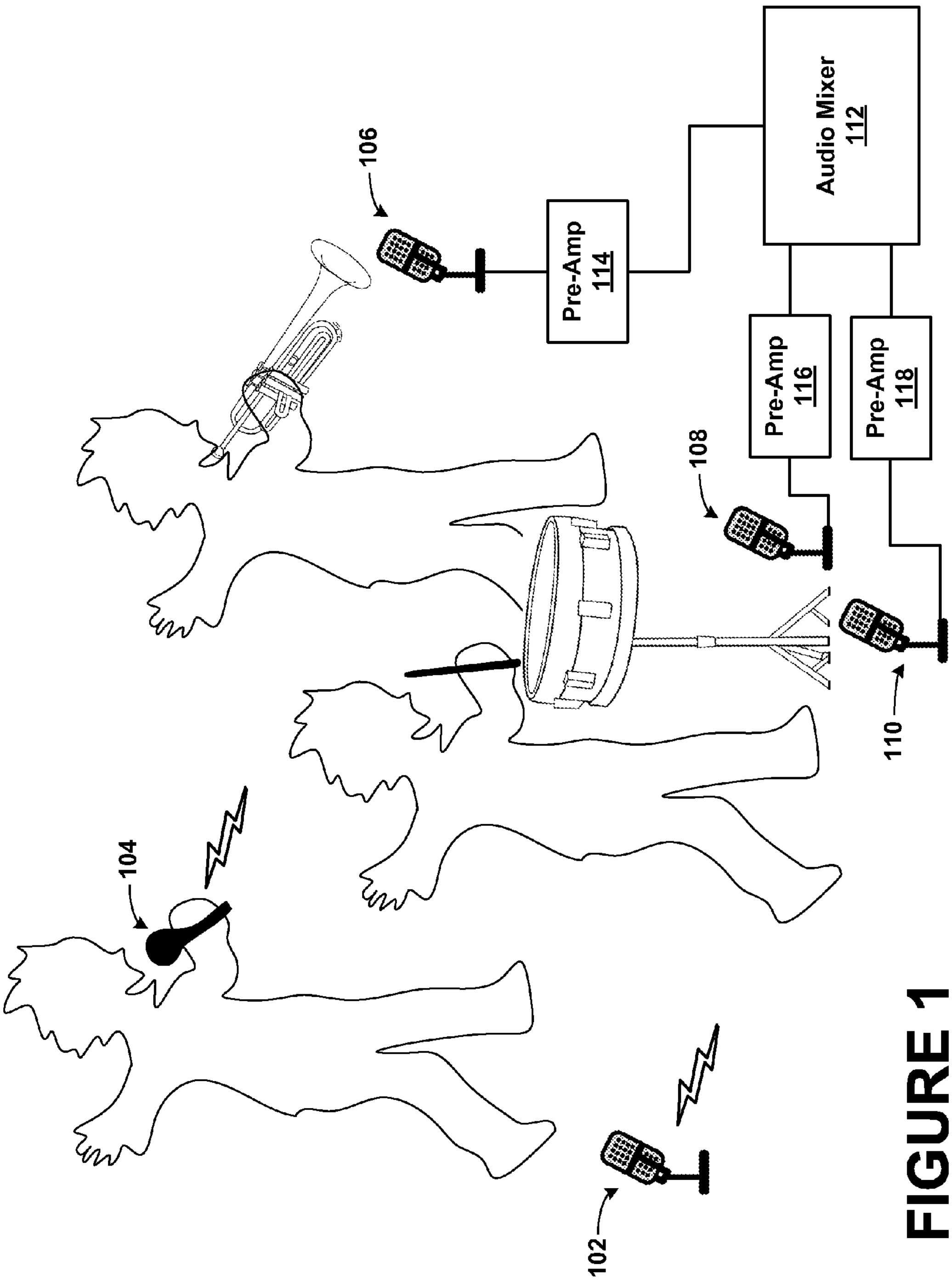
FIG. 1 is an example system for combining audio signals.

Referring now to the figures, FIG. 1 is an example system for combining audio signals. The system includes microphones 102, 104, 106, 108 and 110 each placed at selected areas in a room. For example, microphones 108 and 110 are placed on opposite sides of a drum, and microphone 102 may be placed at a rear of the room to record sound from that perspective. Each microphone outputs to an audio mixer 112. The microphones may output directly to the audio mixer 112, or may output to an intermediary device, such as a pre-amplifier, which connects to the audio mixer 112. In FIG. 1, pre-amps 114, 116, and 118 are shown connecting microphones 106, 108 and 110 to the audio mixer 112. The pre-amps 114, 116, and 118 and/or the audio mixer 112 may adjust a signal output from the microphone. The microphones may be physically coupled to the pre-amps and the audio mixer via a wired connection, or via a wireless connection. In such a case, the microphones may communicate with both the pre-amps and audio mixer, or just with the pre-amps, which in turn, communicate with the audio mixer. In addition, functions of the pre-amps 114, 116, and 118 may be built into the audio mixer 112 as well.

Each microphone in FIG. 1 will receive sound waves that have a phase different from sound waves received at the other microphones due to positioning of the microphones in the room. To combine the signals in an additive fashion, the signals need to be substantially in phase. Thus, signals from the microphones are adjusted at the microphone, by the pre-amps 114, 116 and 118, or by the audio mixer 112 so that the signals are substantially in phase for each frequency prior to combining the signals.

As a specific example, individual audio signals from each microphone are adjusted using a phase splitter, and combined with each other once an appropriate adjustment is determined. A user may manually adjust a phase of a signal output from the microphones until the sound is at a desirable level. For example, a user may desire to have the signals from all microphones add in phase to achieve a maximum level of sound (or volume), and thus, may adjust the phase of the signals until the level of volume is at a maximum.

Figure 2A:
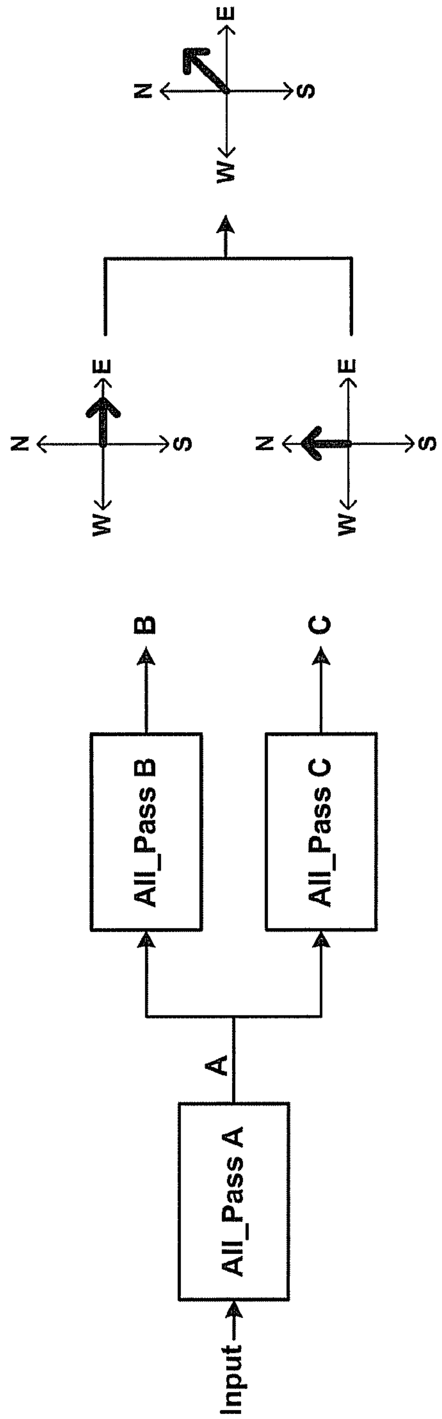
FIGS. 2A-2D illustrate example filter systems to adjust a phase of an input signal.

FIG. 2A illustrates a filter system to adjust the phase of an input signal. The system includes Allpass filter A, Allpass filter B and Allpass filter C. Each Allpass filter may be a digital or analog filter that passes all frequencies of a signal equally, but changes a phase relationship between various frequencies. The Allpass filters do so by varying a propagation delay with frequency.

Allpass filter A is a pre-equalizing Allpass filter that results in an overall linear phase shift of a signal from input to signal A to the input of filters B and C. Allpass filters B and C perform as splitters to create two signals that are each 90° apart from each other. When doing so, portions of the resulting signals may be delayed and the resulting signals may not be proportional to each other in phase over the entire spectrum. Thus, Allpass filter A introduces a corrective delay into the signal prior to being split. An optimization procedure is performed to design Allpass filter A to add corrective delay into the signal. Allpass filter A can then be set to add delay where no delay has been added in the signal, and to not alter the signal at times when a delay will be added by Allpass filters B and C so that the entire signal output from Allpass filters B and C is delayed in the same manner and proper time alignment of the signal can be achieved.

Alternatively, a post-equalizing filter may be inserted after each of the splitting filters B and C to correct for the delay. However, using a pre-equalizing filter may be a more economical manner of correcting for delay distortions.

Allpass filters B and C shift a phase of the signal so that the two output signals B and C are 90° apart from each other. The phase distortion has been corrected by Allpass A. The output of Allpass B filter is considered a reference phase for the signal. The reference phase is referred to as due East for ease of description, referring to the cardinal directions of a compass. The output of Allpass C is considered due North, since the output is 90° advanced from the output of Allpass B (e.g., 90° advanced from due East). A linear combination of the due East signal and the due North signal provides a signal in a North East quadrant. The reference to the cardinal directions of North and East for the signals is arbitrary but helpful in identifying a relationship between the outputs of the filters. No matter the reference notation, the signals output from the Allpass filters B and C will be 90° apart from each other or about 90° apart from each other in phase.

A transformation of a given signal in such a way as to make all spectral components about 90° apart from a reference signal is called a Hilbert Transform. Linear combinations of the reference signal and the Hilbert Transform of the reference signal can produce all phases of the signal from about 0° to about 360°. Thus, Allpass filters B and C may be Hilbert transform filters that tale an input signal and output a signal whose frequency components are phased shifted by an amount such that the signals output from Allpass filters B and C are 90° apart from each other in phase.

Particularly, the Hilbert transform of the signal $x(t)$ is defined to be the signal whose frequency components are all phased shifted by $$-\frac{\pi}{2}$$

radians. The resulting signal is denoted:

$$\hat{x}(t)=H\{x(t)\}$$

The Hilbert transform, $\hat{x}(t)$, is produced by passing x(t) through a filter with a transfer function H(f)=−j sgn(f), where sgn is the signum function:

$$\operatorname{sgn}x = \begin{cases} -1 & \text{if } x < 0, \\ 0 & \text{if } x = 0, \\ 1 & \text{if } x > 0. \end{cases}$$

The magnitude and phase of H(f) are:

$$|H(f)| = 1$$

$$\text{phase} = -\frac{\pi}{2}\text{sgn(f)}$$

The Hilbert transform differs from that of a pure time delay filter in that both the Hilbert transform and a general time delay filter would output a signal that has the same magnitude but the time delay filtered signal has a phase that is linear in frequency instead of constant as with the Hilbert transformed signal.

In effect, using the Hilbert transform, all negative frequencies of a signal receive a +90° phase shift and all positive frequencies of a signal receive a −90° phase shift. The Hilbert transform only effects the phase of the signal. The Hilbert transform has little or no effect on the amplitude of a signal. The signal and its Hilbert Transform are orthogonal because by rotating the signal 90°, the output signal is orthogonal to the original signal.

Thus, each of Allpass filters B and C may be Hilbert transform filters that receive the same input signal, and output a signal phase shifted by an amount such that the signals output from Allpass filters B and C are 90° apart from each other in phase. The Allpass filters B and C do not affect the amplitude of the signal; however, the Allpass filters B and C will introduce a delay distortion into the signal, which will be compensated for by the pre-equalization Allpass A filter. Delay distortion may only be present when the phase verses frequency characteristic of the signal is not a straight line function in a frequency region of interest. The pre-equalization Allpass A filter provides compensating delay distortion that cancels the delay in networks following the filters, for example.

Since outputs from each of Allpass filters B and C are 90° apart from each other in phase, the Allpass filters B and C may introduce varying or different phase shifts on the received input signal. The Hilbert transform is an ideal mathematical transform that may be physically unrealizable, but using filters, an approximation can be made to achieve a phase difference between two signals that is about 90° over a frequency band of interest. Thus, the Hilbert Transform of a signal can be achieved by a filter having an input port and two output ports, so that the signals output from the output ports are 90° degrees apart in phase. Using this configuration, a signal output from one port is a Hilbert transform of a signal output from the other port. Referring back to FIG. 2A, signal C is a Hilbert transform of signal B.

Allpass filter B and Allpass filter C provide phase distortions in such a way that the two output signals are 90° degrees apart. For example, one of the filters may provide an output signal phase shifted by 20° from the input signal, and the other filter may provide an output signal phase shifted by 70° (in the other direction) from the input signal so that the two output signals are 90° apart from each other, but not necessary 90° apart in phase from the input signal. As another example, Allpass filter A may provide a 45° degree leading phase shift and Allpass filter B may provide a 45° lagging phase shift so that the output signals of Allpass filters A and B are 90° apart from each other. Any type of phase shift may be provided by the Allpass filters A and B, such that one of the filters provides a first phase shift and the other filter provides a compensating phase shift to provide the remaining difference in phase to make up the entire 90° phase difference between the two output signals.

Figure 2B:
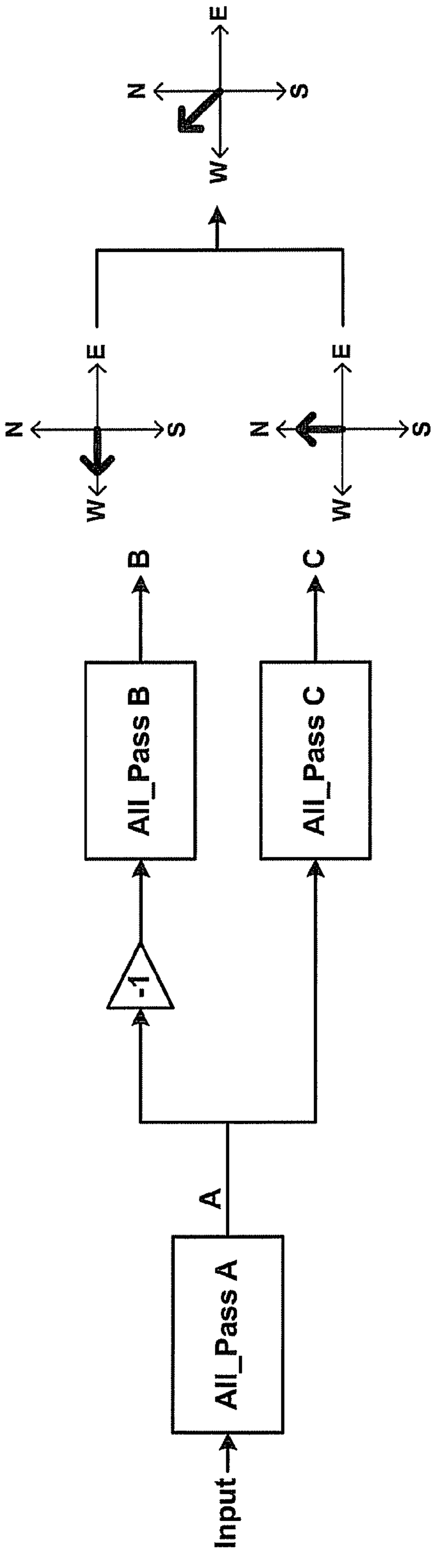

FIG. 2B illustrates another example filter system to adjust the phase of an input signal. The filter system in FIG. 2B is the same as that in FIG. 2A, except that an inverter, or a 180° signal inversion, is inserted in the path of the Allpass B filter so that the output of Allpass B filter would be considered due West. Linear combinations of the two outputs of filters B and C of FIG. 2B would span the North West quadrant. In another example, the inverter could be placed after the Allpass B filter as well to obtain the same result.

Figure 2C:
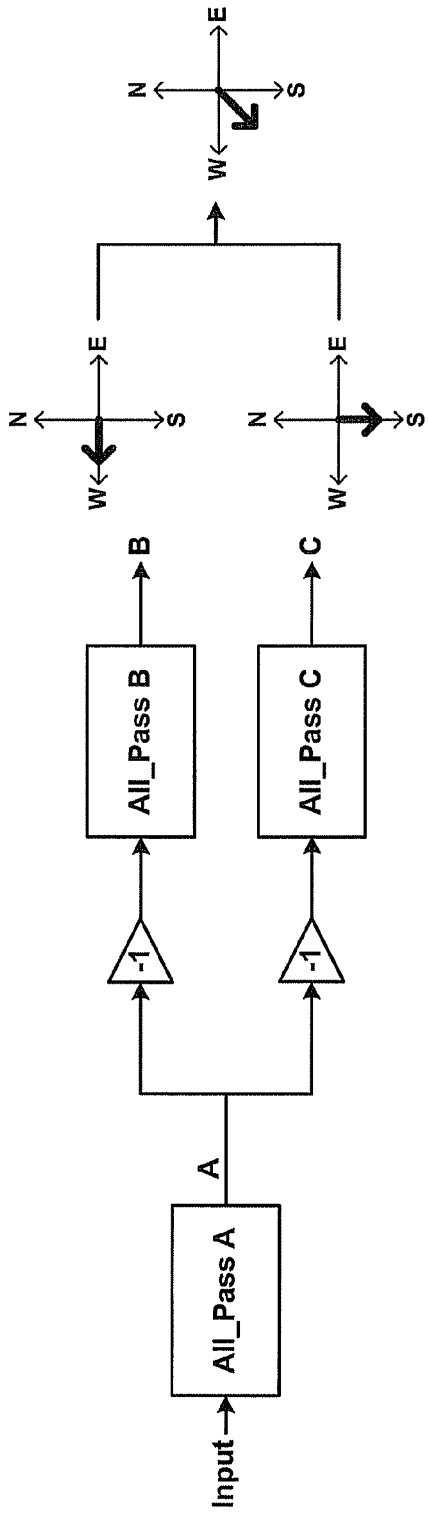

FIG. 2C illustrates another example filter system to adjust the phase of an input signal. The filter system in FIG. 2C is the same as that in FIG. 2B, except that an inverter has also been inserted into the path of the Allpass C filter so that the output of Allpass C filter would be considered South. Linear combinations of the two outputs of filters B and C of FIG. 2C would span the South West quadrant. In another example, the inverter could be placed after the Allpass C filter as well to obtain the same result.

Figure 2D:
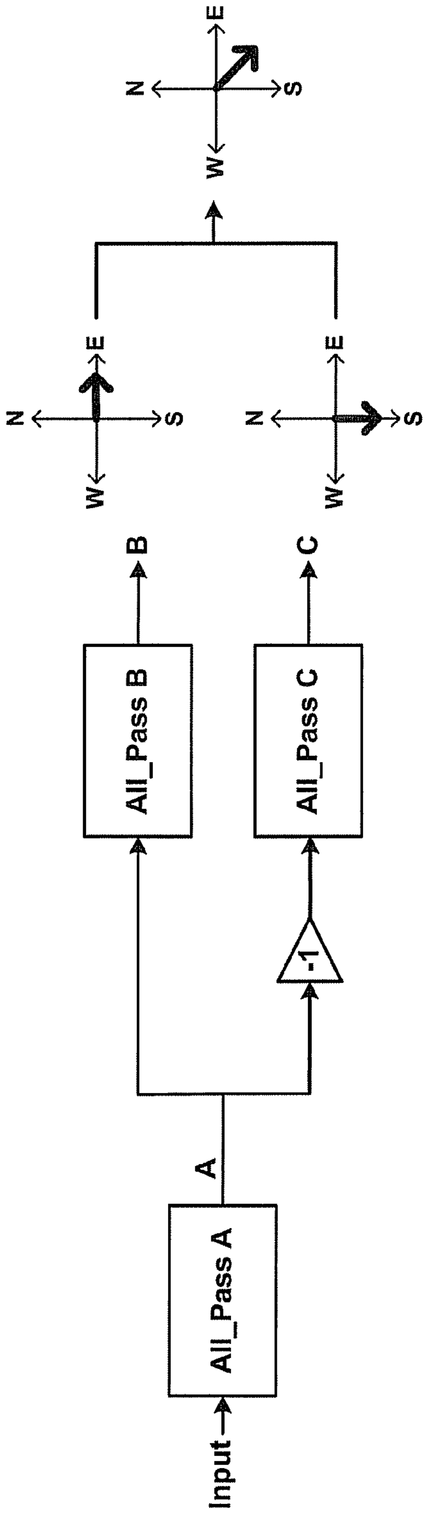

FIG. 2D illustrates another example filter system to adjust the phase of an input signal. The filter system in FIG. 2D is the same as that in FIG. 2A, except that an inverter has been inserted into the path of the Allpass C filter so that the output of Allpass C filter would be considered South. Linear combinations of the two outputs of filters B and C of FIG. 2D would span the South East quadrant.

As seen in FIGS. 2A-2D, an input signal is split using a Hilbert transform filter, or Hilbert transform filter-pair, so that two signals are created each of which is 90° apart from the other in phase. These two signals, or vectors, can span the entire phase range from 0° to 360° using a combination of the vectors. For example, inserting an inverter into the filter path can transform a signal into a different quadrant, and by combining variations of the signals, a resulting sum can be of any phase shift.

Figure 3:
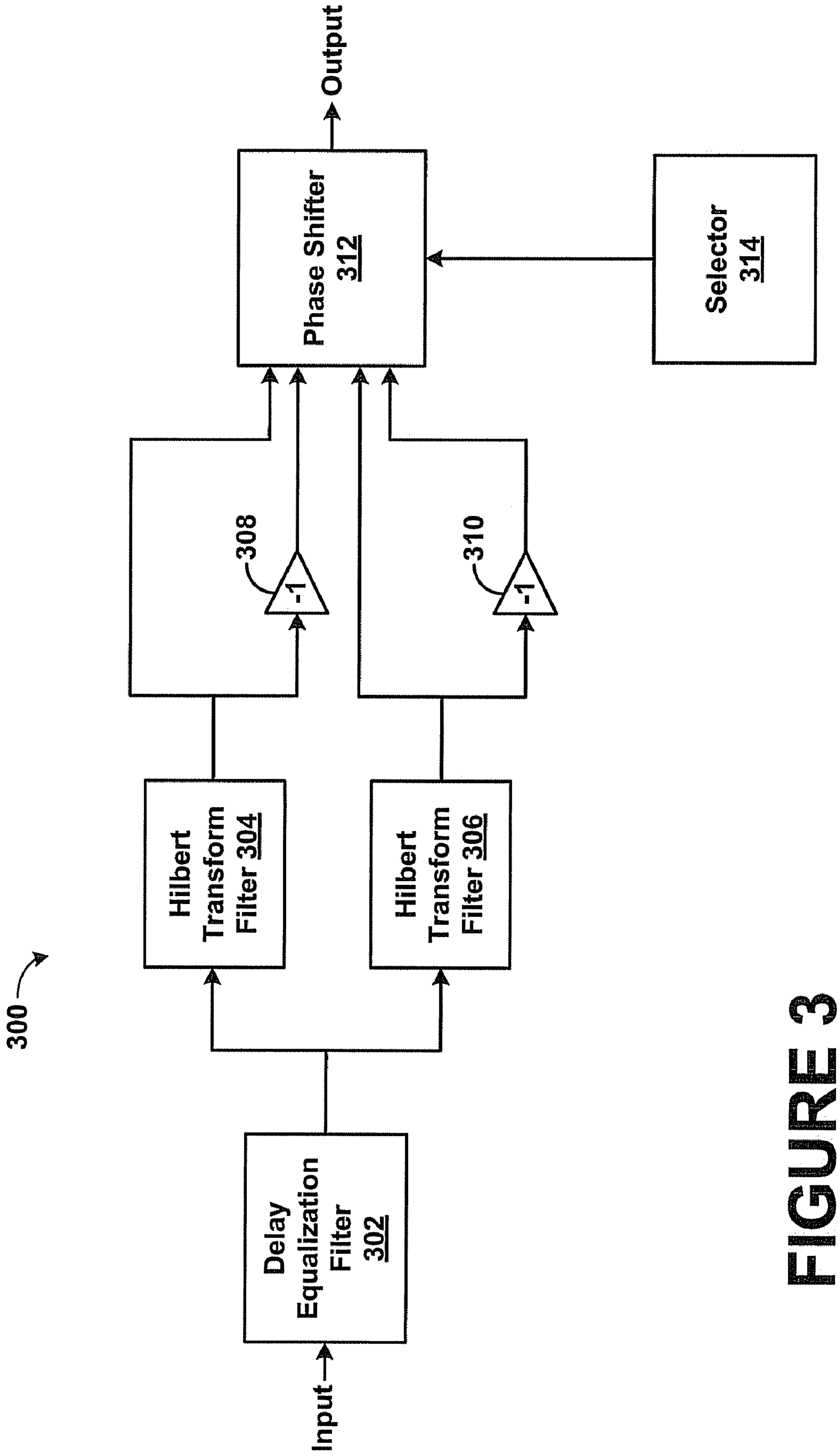
FIG. 3 illustrates an example of an audio signal adjustment system.

FIG. 3 illustrates an example of an audio signal adjustment system 300. The system 300 receives an input signal at a delay equalization filter 302, which introduces a delay within the signal to compensate for processing delays that will be introduced by the system 300. The delay equalization filter 302 outputs to a first Hilbert transform filter 304 and a second Hilbert transform filter 306, each of which performs a Hilbert transform of the signal to shift a phase of the signal by 90°. The Hilbert transform filters 304 and 306 both output signals in a non-complimented form, and a complimented form by passing a signal through inverters 308 and 310, respectively. A phase shifter 312 receives the non-complimented and complimented signals, and through combinations of these signals, can output a signal that has a phase between 0° and 360° and with the same magnitude as the input signal. A selector 314 can be operated by a user to select the phase of the output signal.

The system 300 may be implemented within a microphone, pre-amp or audio mixer, so that an output of a microphone is passed through the system 300, to create four vector signals that when combined together in a selected manner, can output a signal that has a phase somewhere between 0° and 360°.

The phase shifter 312 will receive four signals. Conceptually, each signal resides in a different quadrant, so that a combination of the signals can result in a signal that has a phase between 0° and 360°. For example, a signal output from the Hilbert Transform filter 304 may have a phase between 0° and 90°, and the compliment of that signal output from inverter 308 will have a phase between 180° and 270°. Similarly, a signal output from the Hilbert Transform filter 306 may have a phase between 90° and 180°, and the compliment of that signal output from inverter 310 will have a phase between 270° and 360°.

The selector 314 may define quadrants for the signal using two bits (e.g., 00—first quadrant, 01—second quadrant, 10—third quadrant, and 11—fourth quadrant). The selector 314 may define a phase within the quadrant using six bits, or 64 increments per 90°. The present application provides for a sweepable control on each recording device, pre-amp, or audio mixer, for example, to allow a signal to be adjusted in phase between 0° or about 0° and 360° or about 360°. In one application, a user may manually adjust a microphone by rotating a sweep dial until a desired degree of loudness of the signal is achieved. The phase shifter 312 will receive instructions from the selector 314 indicating how to combine the signals.

Figure 4:
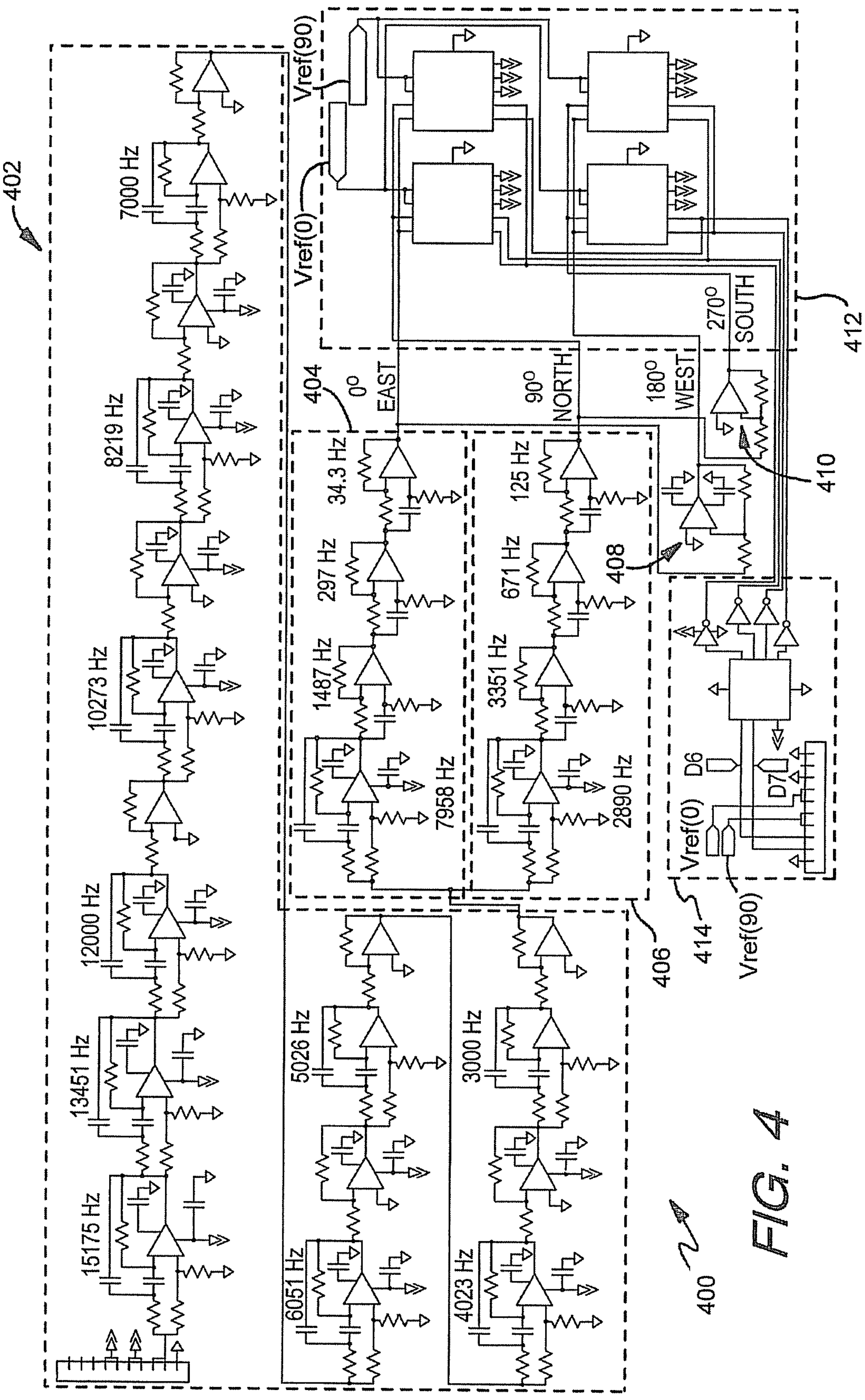
FIG. 4 illustrates one example implementation of a portion of the system of FIG. 3.

FIG. 4 illustrates one example implementation 400 of a portion of the system 300. For example, the system 400 includes a pre-Hilbert delay equalization filter 402 comprising multiple stages of allpass sections designed at individual frequencies and with various quality factors. These sections combine the signal across the frequency band to produce a desired pre-distortion to correct a delay distortion in the subsequent networks of the implementation 400.

As an example, the pre-equalizing filter 402 cures imperfections in the transmission through the a remainder of the implementation 400. The pre-equalization filter 402 has stages, each of which are second order filters including two capacitors with feedback that produce approximately constant gain and a variable phase, for example. The pre-equalization filter 402 establishes a frequency band of interest. For example, each stage passes a portion of the signal having a given frequency to control a phase between frequencies of about 15 kHz to about 34 Hz, as shown in FIG. 4. Of course, the pre-equalization filter can be implemented to control a phase between any desired frequency band.

The pre-equalization filter 402 may include a combination of mini-Allpass filters to pass only certain delays at a stated frequency. Center frequencies and Quality factors of each section are chosen based on iterative optimization results. For example, samples can be run to find frequencies by minimizing error in a delay, and by optimizing the outputs using a total square error minimization, for example. Frequencies can be adjusted to make a sum delay passing through the pre-equalizer filter to ports of the Hilbert Transform filters constant. Once a delay is a constant (or about constant as can be realized), a phase is about a straight line, and then no phase or delay distortion will be seen in the output signals.

The delay equalization filter 402 outputs a signal to a first Hilbert transform filter 404 and a second Hilbert transform filter 406, each of which outputs a signal (and a compliment of the signal through inverters 408 and 410) to a phase selector 412. The phase selector 412 receives inputs from a selector 414 and uses the inputs to determine how to adjust the phase of each signal. The phase selector 412 includes four D/A converters to receive inputs and to enable adjustment of the phases of the signals within each of the four quadrants, and outputs two reference signals: $V_{ref(0)}$ and $V_{ref(90)}$ (where $V_{ref(0)}$ is a reference signal and $V_{ref(90)}$ is a signal that has a phase 90° apart from $V_{ref(0)}$, thus the phases of signals $V_{ref(0)}$ and $V_{ref(90)}$ are not necessarily 0° and 90°).

As mentioned above with reference to FIG. 2, the Hilbert Transform filters 404 and 406 will output two signals that are 90° apart from each other in phase. Each filter may adjust the phase by different amounts so long as the outputs of the filters are 90° apart from each other in phase. To determine how much each filter adjusts the phase, an input from a user is received (described below).

Figure 5:
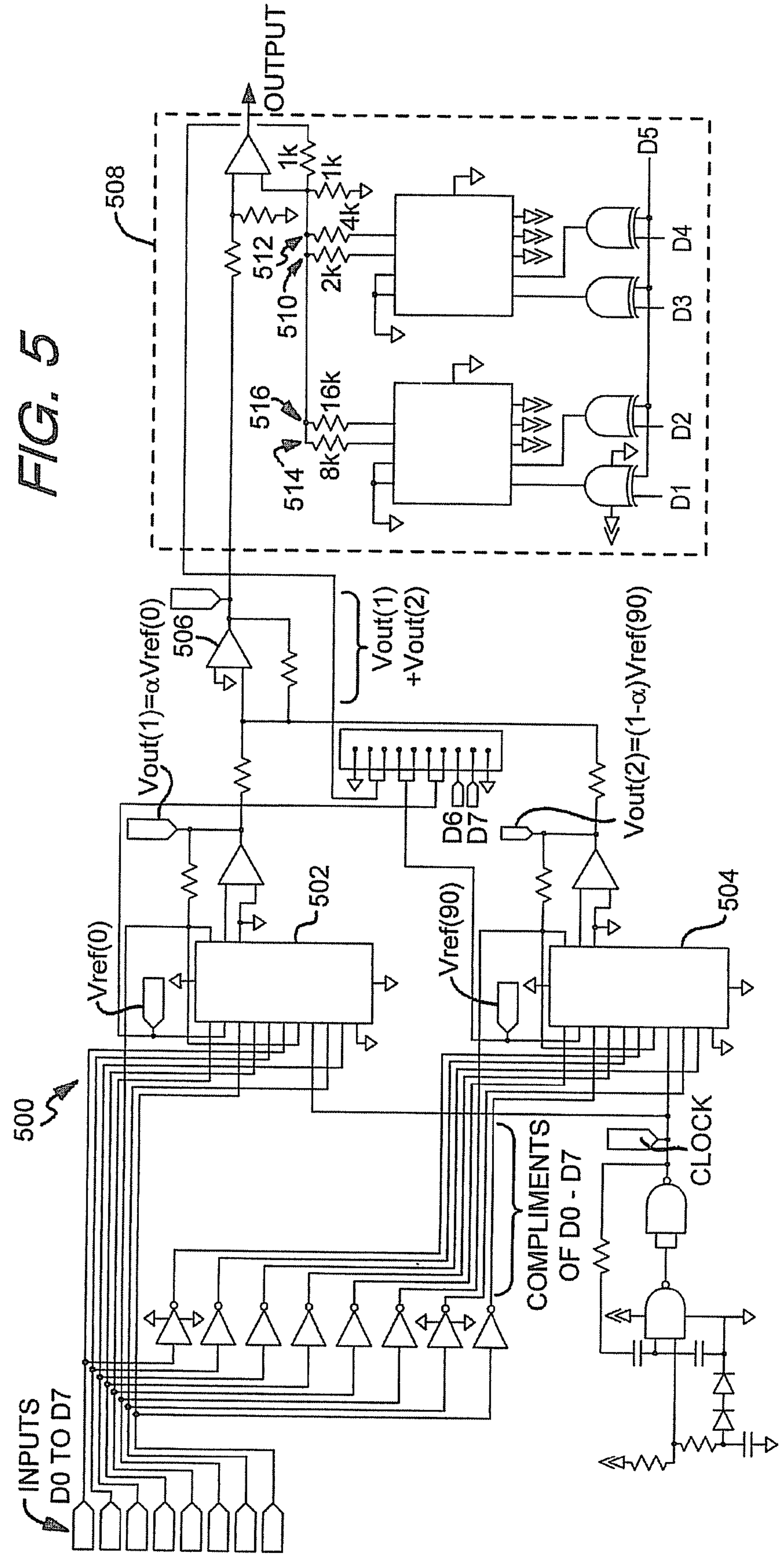
FIG. 5 illustrates one example of a circuit to combine phase shifted signals.

FIG. 5 illustrates one example of a circuit 500 to combine signals output from the Hilbert transform filters. The circuit receives eight inputs D0-D7 from a selector (described below). A counter may be used that is connected to a potentiometer or switch and produces the 8 bits, D0-D7, based on a user input. Two bits (D6-D7, for example) are used to determine a quadrant of a phase shift and the remaining six bits determine increments of the phase within the quadrant.

The bits D6-D7 may establish within which quadrant the delay is to be introduced. For example, when D6-D7 is 00 then the delay is in the first quadrant, when D6-D7 is 01 the delay is in the second quadrant, when D6-D7 is 10 the delay is in the third quadrant, and when D6-D7 is 11 the delay is in the fourth quadrant. Then to produce a signal in the desired quadrant, linear combinations of the 0°, 90°, 180° and 270° signals are made. Thus, the D6-D7 of 00 selects linear combination of the 0° and 90° signals, D6-D7 of 01 selects a linear combination of the 90° and 180° signals, D6-D7 of 10 selects a linear combination of the 180° and 270° signals and D6-D7 selects a linear combination of the 270° and 0° signals.

Note that the reference to a 0°, 90°, 180°, and 270° signal does not necessarily in the phase of the signal. These reference names are used to indicate a difference in phase, such that when looking at the signals referred to as 0° and 180°, for example, the two signals will have a 180° phase difference. Thus, the signals are taken in relation to one another.

As a specific example, for D6-D7 of 00, the signal will have a phase shifted to be in the first quadrant (between about 0° and about 90°). To achieve a phase shift, two of the signals are added together. Thus, the 0° signal and the 90° degree signal, as shown output from the Hilbert transform filters 404 and 406, are added together. They can be added in any fashion, such as for instance, the full signal of each to achieve a signal with a 45° phase angle, or to achieve a different phase angle, more or less of either the 0° or the 90° signal can be added. Thus, the two signals are linearly added together to can create any phase signal in the first quadrant.

The inputs D0-D7 are fed to a first D/A multiplier 502 and a second D/A multiplier 504. The first D/A multiplier 502 receives a first voltage reference signal, as indicated by bits D6-D7, and the second D/A multiplier 504 receives the second reference voltage signal, as indicated by bits D6-D7. That is, for D6-D7 being one of the following, 00, 01, 10, 11, the signals provided to the D/A multipliers are (0°, 90°), (90°, 180°), (180°, 270°), (270°, 0°) multipliers 502 and 504 adjust the phase of an output signal by multiplying the two orthogonal components by a weight value.

Two reference signals, $V_{ref(0)}$ and $V_{ref(90)}$, are received by the D/A multipliers 502 and 504 respectively, and are used in combination to form an output signal $V_{out}$ as follows:

$$V_{out}=\alpha V_{ref(0)}+(1-\alpha)V_{ref(90)} \quad \text{Equation (1)}$$

where α is a parameter or a constant. The combination of the two reference signals in this manner will enable a resulting output signal to have a phase as desired between about 0° and about 90°. Next, the remaining 6 bits, D0-D5, coming out of the counter are multiplied by each of the reference signal and the reference +/−90° signal, which conceptually results in a portion of one signal (e.g., portion of the 0° signal) and a portion of the other signal (e.g., portion of the 90° signal). Specifically, the bits D0-D5 are sent to the D/A multiplier 502 and are multiplied by a first reference signal ($V_{ref(0)}$), and the inverse of bits D0-D5 are sent to D/A multiplier 504 and are multiplied by the second reference signal ($V_{ref(90)}$) so that when the outputs of the D/A multipliers 502 and 504 ($V_{(out(1)}$ and $V_{out(2)}$), are added together in a summing amplifier 506, a full signal is achieved. As one example, when D0-D5 is 111111, the output of D/A multiplier will be the $V_{ref(0)}$ signal and the output of the D/A multiplier 504 will be zero (because the $V_{ref(90)}$ will be multiplied by 000000). Thus, the bits D0-D5 determine the value of the constant α within the equation above.

For example, consider one spectral component in a signal at a given frequency, $f_n$. The component may be $b_n \sin(2\pi f_n)$, which if shifted 90° would be $b_n \cos(2\pi f_n)$. A linear combination ($V_{out}$) of these two signals (e.g., signals 90° apart from each other) would be:

$$V_{out}=\alpha b_n \sin(2\pi f_n)+(1-\alpha)b_n \cos(2\pi f_n)=b_n\text{SQRT}(\alpha^2+(1-\alpha)^2)\sin(2\pi f_n+\tan^{-1}((1-\alpha)/\alpha)) \quad \text{Equation (2)}$$

When α=1, $\tan^{-1}((1-\alpha)/\alpha)=0$, and when α=0°, $\tan^{-1}((1-\alpha)/\alpha)=90°$. Thus, the phase is varied from 0° to 90° by varying α from 1 to 0.

However, the resultant output signal may not provide the same output power signal for all values of α. For example, if both $V_{ref(0)}$ and $V_{ref(90)}$ have a power of magnitude $V^2=1$, then $V^2_{out}$ out would also have a power of a magnitude of 1 for α=0 and α=1. But, for α=0.5 at the midpoint on a potentiometer, for example, $V^2_{out}$ would have a power of magnitude 0.5 as well. It is desired though to provide a nearly constant power for the output signal, and to do so, the factor α can be implemented digitally as a gain factor in a multiplying D to A converter.

A gain adjustment circuit 508 is thus provided to alter a gain of the output signal ($V_{out}$) based on input bits D1 -D5 to maintain an equal gain level of 1 or about 1 regardless of the phase change (D0 is not used because it has too small of a value). For example, the sum of two 90° phase shifted signals adds together on a power basis. That is, two signals that have a 90° phase difference are orthogonal to one another, and the total power of the sum of the two signals is the sum of the individual power of each signal. A linear combination of the two signals can be represented by:

$$E_{out}=\alpha E_{ref}+(1-\alpha)E_{90} \quad \text{Equation (3)}$$

where $E_{ref}$ is a first signal, $E_{90}$ is the signal phase shifted by 90° compared to the $E_{ref}$ and α is a gain constant applied to the signals that varies from 0 to 1. The total power out, $P_{out}$, is given by the expression:

$$P_{out}=\alpha^2 P_{ref}+(1-\alpha)^2 P_{90} \quad \text{Equation (4)}$$

If both $P_{ref}$ and $P_{90}$ have unity power (e.g., 1), then $$P_{out}=\alpha^2+(1-\alpha)^2 \quad \text{Equation (5)}$$

For α=0, $P_{out}=1$; for α=1, $P_{out}=1$, and for α=½, $P_{out}=½$. Thus, for an RMS output voltage, the RMS value of the sum is 1 at α=0 or 1, but 0.707 ($1/\sqrt{2}$) at the mid point of α=½. Thus, the Hilbert transform has an amplitude transfer characteristic given by:

$$(E_{rms\_out}/E_{rms\_in})=\sqrt{(\alpha^2+(1-\alpha)^2)} \quad \text{Equation (6)}$$

when the sum of the two outputs is of the form Equation (3).

If the value of α (and its binary equivalent, referred to as BIN α) are varied from 0 to 1, and an uncorrected RMS voltage is calculated, a correction factor (and its binary equivalent, referred to as BIN COR) to renormalize the voltage power can be calculated. Table 1 below shows an example calculation when each of the two orthogonal signals has an average squared value of 1. The data for the Uncorrected RMS voltage in Table 1 was created using Equation 6, and varying α from 0 to The Correction factor is calculated by taking the inverse of the Uncorrected RMS voltage.

TABLE 1

| α | Uncorrected RMS Voltage | CORRECTION FACTOR | BIN α | BIN COR |
|---|---|---|---|---|
| 0 | 1 | 1 | 0 | 1.00000 |
| 0.03125 | 0.969253901 | 1.031721408 | 1000 | 1.00001 |
| 0.06250 | 0.939581024 | 1.064304168 | 10000 | 1.00010 |
| 0.09375 | 0.911086234 | 1.097590945 | 11000 | 1.00011 |
| 0.12500 | 0.883883476 | 1.131370850 | 100000 | 1.00100 |
| 0.15625 | 0.858095639 | 1.165371265 | 101000 | 1.00101 |
| 0.18750 | 0.833854004 | 1.199250702 | 110000 | 1.00110 |
| 0.21875 | 0.811297187 | 1.232593945 | 111000 | 1.00111 |
| 0.25000 | 0.790569415 | 1.264911064 | 1000000 | 1.01000 |
| 0.28125 | 0.771818065 | 1.295642128 | 1001000 | 1.01001 |
| 0.31250 | 0.755190373 | 1.324169422 | 1010000 | 1.01010 |
| 0.34375 | 0.740829349 | 1.349838530 | 1011000 | 1.01011 |
| 0.37500 | 0.728868987 | 1.371988681 | 1100000 | 1.01011 |
| 0.40625 | 0.719429027 | 1.389991177 | 1101000 | 1.01100 |
| 0.43750 | 0.712609641 | 1.403292831 | 1110000 | 1.01100 |
| 0.46875 | 0.708486503 | 1.411459492 | 1111000 | 1.01101 |
| 0.50000 | 0.707106781 | 1.414213562 | 10000000 | 1.01101 |
| 0.53125 | 0.708486503 | 1.411459492 | 10001000 | 1.01101 |
| 0.56250 | 0.712609641 | 1.403292831 | 10010000 | 1.01100 |
| 0.59375 | 0.719429027 | 1.389991177 | 10011000 | 1.01100 |
| 0.62500 | 0.728868987 | 1.371988681 | 10100000 | 1.01011 |
| 0.65625 | 0.740829349 | 1.349838530 | 10101000 | 1.01011 |
| 0.68750 | 0.755190373 | 1.324169422 | 10110000 | 1.01010 |
| 0.71875 | 0.771818065 | 1.295642128 | 10111000 | 1.01001 |
| 0.75000 | 0.790569415 | 1.264911064 | 11000000 | 1.01000 |
| 0.78125 | 0.811297187 | 1.232593945 | 11001000 | 1.00111 |
| 0.81250 | 0.833854004 | 1.199250702 | 11010000 | 1.00110 |
| 0.84375 | 0.858095639 | 1.165371265 | 11011000 | 1.00101 |
| 0.87500 | 0.883883476 | 1.131370850 | 11100000 | 1.00100 |
| 0.90625 | 0.911086234 | 1.097590945 | 11101000 | 1.00011 |
| 0.93750 | 0.939581024 | 1.064304168 | 11110000 | 1.00010 |
| 0.96875 | 0.969253901 | 1.031721408 | 11111000 | 1.00001 |
| 1 | 1 | 1 | 100000000 | 1.00000 |

Referring back to the input digits received from the counter (D0-D7), if D1-D5 are the top five digits of BIN α, then the ideal correction factor to obtain a signal with a magnitude of 1 would be the corresponding values in the BIN COR column. To obtain a realized correction factor, the most significant digit (e.g., D5) is individually exclusive-ORed with the other 4 digits (D1-D4) to produce a gain compensation approximation (EXOR5) that is accurate to less than 1 dB (0.3455). As shown in FIG. 5 within the gain compensation stage 508, each of input bits D1-D4 is exclusive-ORed with input bit D5 to produce the gain correction factor. Table 2 includes values for all possible values of D0-D5 up to 100000 in the first column, the calculated gain correction factor in the second column, the ideal binary correction factor in the third column (which is also the last column in Table 1), and an approximation of an error (which is the difference between the calculated correction and the ideal correction) in the last column. The ideal binary correction value is a value for the gain that would make the resulting output signal have a magnitude of 1, i.e., so that the magnitude of the signal does not change. Using this method, the gain correction factor is accurate to less than 1 dB.

TABLE 2

| BINARY ADDRESS D0-D5 | APPROXIMATE EXOR5 Gain CORRECTION | IDEAL BIN CORRECTION | GAIN ERROR BY APROX |
|---|---|---|---|
| 000000 | 00000 | 1.00000 | 00000 |
| 000001 | 00001 | 1.00001 | 00000 |
| 000010 | 00010 | 1.00010 | 00000 |
| 000011 | 00011 | 1.00011 | 00000 |
| 000100 | 00100 | 1.00100 | 00000 |
| 000101 | 00101 | 1.00101 | 00000 |
| 000110 | 00110 | 1.00110 | 00000 |
| 000111 | 00111 | 1.00111 | 00000 |
| 001000 | 01000 | 1.01000 | 00000 |
| 001001 | 01001 | 1.01001 | 00000 |
| 001010 | 01010 | 1.01010 | 00000 |
| 001011 | 01011 | 1.01011 | 00000 |
| 001100 | 01100 | 1.01011 | 00001 |
| 001101 | 01101 | 1.01100 | 00001 |
| 001110 | 01110 | 1.01100 | 00010 |
| 001111 | 01111 | 1.01101 | 00010 |
| 010000 | 01111 | 1.01101 | 00010 |
| 010001 | 01110 | 1.01101 | 00001 |
| 010010 | 01101 | 1.01100 | 00001 |
| 010011 | 01100 | 1.01100 | 00000 |
| 010100 | 01011 | 1.01011 | 00000 |
| 010101 | 01010 | 1.01011 | 00001 |
| 010110 | 01001 | 1.01010 | 00001 |
| 010111 | 01000 | 1.01001 | 00001 |
| 011000 | 00111 | 1.01000 | 00001 |
| 011001 | 00110 | 1.00111 | 00001 |
| 011010 | 00101 | 1.00110 | 00001 |
| 011011 | 00100 | 1.00101 | 00001 |
| 011100 | 00011 | 1.00100 | 00001 |
| 011101 | 00010 | 1.00011 | 00001 |
| 011110 | 00001 | 1.00010 | 00001 |
| 011111 | 00000 | 1.00001 | 00001 |
| 100000 | 00000 | 1.00000 | 00000 |

MAX DB ERROR = 0.345589216 dB

As shown in Table 2, the gain correction factor mirrors the input bits D0-D5 and increases as do the bits D0-D5 until the bit D5 changes to 1 (which occurs halfway down the Table). At that point, the gain correction factor begins to decrease down to zero.

Thus, the two orthogonal outputs ($V_{ref(0)}$ and $V_{ref(90)}$) are individually multiplied in D/A multipliers 502 and 504 by the binary equivalent of α (e.g., D0-D5) and its binary complement (1−α), respectively. The outputs of the D/A multipliers 502 and 504 are summed as analog signals in a summing amplifier 506, and then passed through the gain compensation stage 508 to weight the output signal according to the EXOR5 values in Table 2 above so that the output signal's amplitude is not affected (or is only minimally affected) by the phase shift. Thus, the summed signal shown in Equation (1) is multiplied by a weight value, β, selected from Table 2 above according to the values of D0-D5 to achieve the phase shifted output signal, as shown below in Equation (7).

$$V_{(phase\ shift)}=\beta V_{out} \qquad \text{Equation (7)}$$

The weight value is applied to the summed signal by selectively switching resistors 510 (2 k ohm), 512 (4 k ohm), 514 (8 k ohm), and 516 (16 k ohm) according to the values output from the exclusive-or circuits. The approximate error in this is 0.345 dB, as shown below in Table 3.

TABLE 3

| α | IDEAL CORRECTION FACTOR | APPROX EXOR5DEC/32 | db error 20LOG(APPROX/IDEAL) |
|---|---|---|---|
| 0 | 1 | 1 | 0 |
| 0.03125 | 1.031721408 | 1.03125 | −0.003969615 |
| 0.06250 | 1.064304168 | 1.0625 | −0.014736487 |
| 0.09375 | 1.097590945 | 1.09375 | −0.030448989 |
| 0.12500 | 1.131370850 | 1.125 | −0.049049248 |
| 0.15625 | 1.165371265 | 1.15625 | −0.068251193 |
| 0.18750 | 1.199250702 | 1.1875 | −0.085527264 |
| 0.21875 | 1.232593945 | 1.21875 | −0.098108027 |
| 0.25000 | 1.264911064 | 1.25 | −0.102999566 |
| 0.28125 | 1.295642128 | 1.28125 | −0.097023648 |
| 0.31250 | 1.324169422 | 1.3125 | −0.076884854 |
| 0.34375 | 1.349838530 | 1.34375 | −0.039266866 |
| 0.37500 | 1.371988681 | 1.375 | 0.019043394 |
| 0.40625 | 1.389991177 | 1.40625 | 0.101009839 |
| 0.43750 | 1.403292831 | 1.4375 | 0.209190937 |
| 0.46875 | 1.411459492 | 1.46875 | 0.345589216 |
| 0.50000 | 1.414213562 | 1.46875 | 0.328657636 |
| 0.53125 | 1.411459492 | 1.4375 | 0.158788691 |
| 0.56250 | 1.403292831 | 1.40625 | 0.018284579 |
| 0.59375 | 1.389991177 | 1.375 | −0.094186907 |
| 0.62500 | 1.371988681 | 1.34375 | −0.180641024 |
| 0.65625 | 1.349838530 | 1.3125 | −0.243650169 |
| 0.68750 | 1.324169422 | 1.28125 | −0.286193527 |
| 0.71875 | 1.295642128 | 1.25 | −0.311500956 |
| 0.75000 | 1.264911064 | 1.21875 | −0.322907252 |
| 0.78125 | 1.232593945 | 1.1875 | −0.323728235 |
| 0.81250 | 1.199250702 | 1.15625 | −0.317164715 |
| 0.84375 | 1.165371265 | 1.125 | −0.306235659 |
| 0.87500 | 1.131370850 | 1.09375 | −0.293738376 |
| 0.90625 | 1.097590945 | 1.0625 | −0.282231535 |
| 0.93750 | 1.064304168 | 1.03125 | −0.27403603 |
| 0.96875 | 1.031721408 | 1 | −0.271248846 |

Figures 6A, 6B:
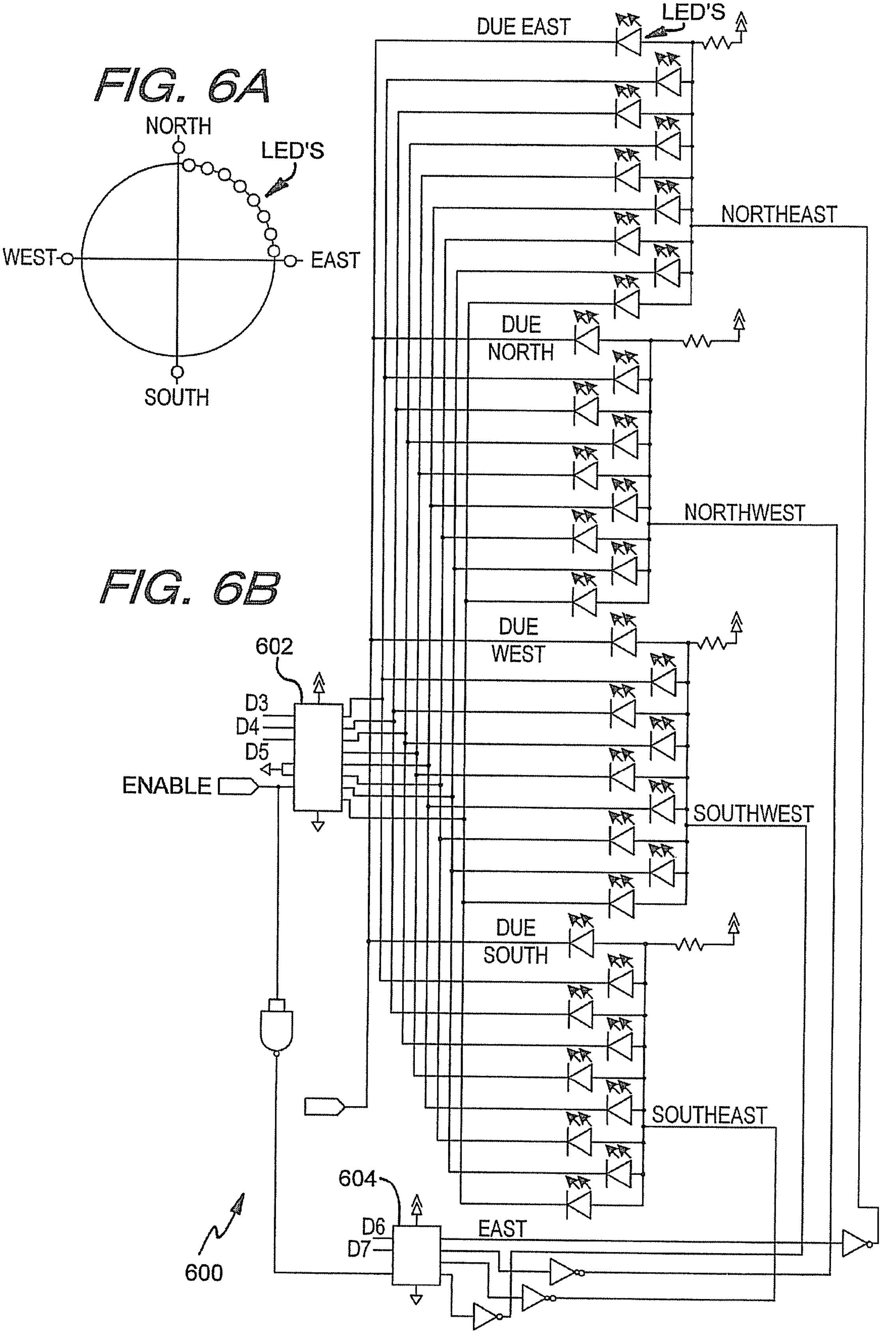
FIGS. 6A-6B illustrate an example illustration and an example circuit to provide a visual display to illustrate how a phase of a signal is adjusted.

FIGS. 6A-6B illustrate an example illustration and an example circuit to provide a visual display to illustrate how a phase of a signal is adjusted. FIG. 6A is a conceptual display that illustrates all four quadrants, and allocates 8 LED's per quadrant, and one LED positioned on each axis. The display will light up an LED to illustrate the phase of a signal.

FIG. 6B illustrates an example circuit 600 to implement the display shown in FIG. 6A. The circuit receives inputs D3-D5 from a selector (described below) to a processor 602 to establish which of the 8 LEDs in a specific quadrant to turn on, and receives two inputs (D6-D7) at another processor 604 to determine which quadrant to enable.

Figure 7:
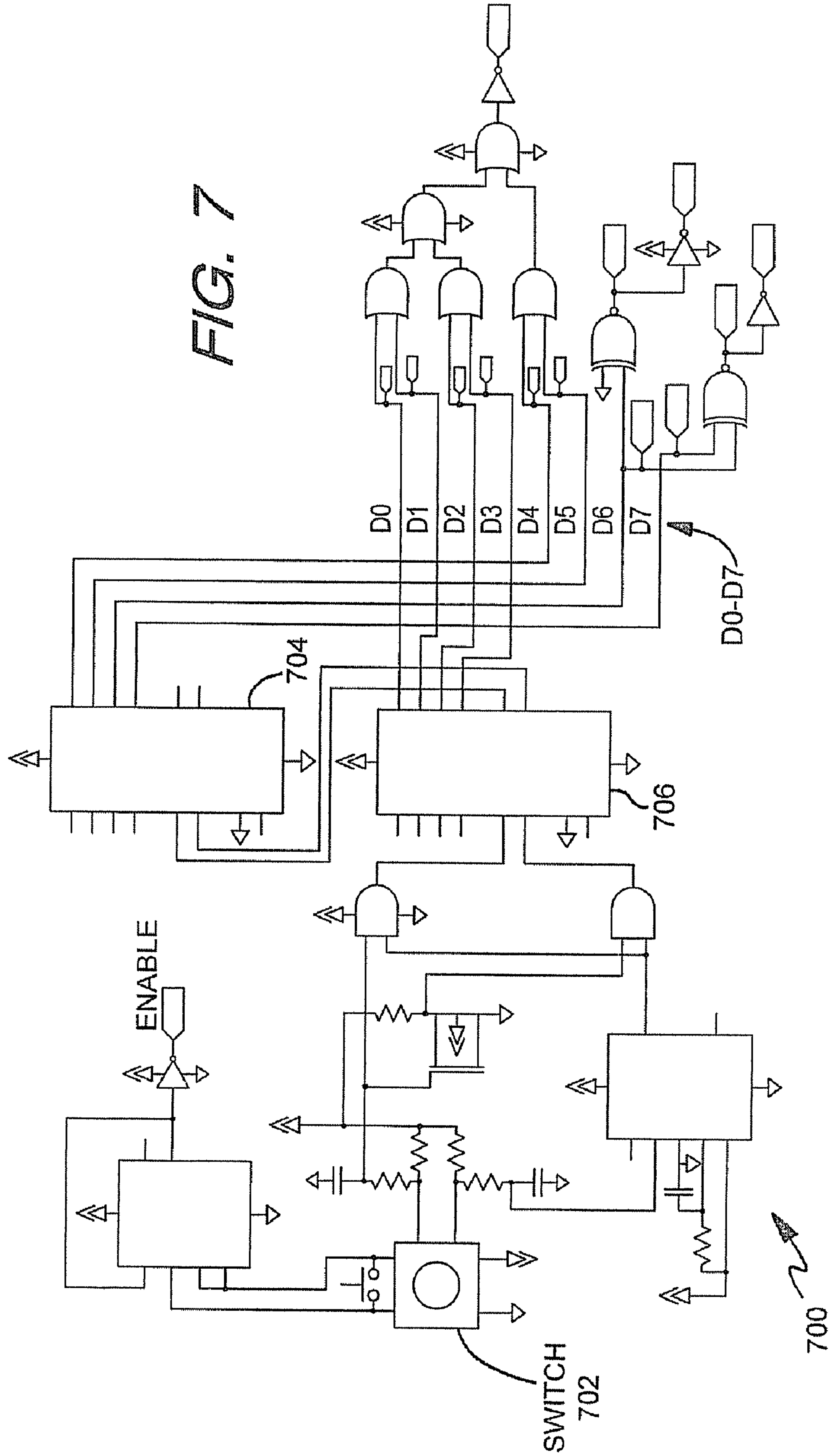
FIG. 7 illustrates an example selector circuit to receive an input from a user that is used to determine how to adjust a phase of a signal.

FIG. 7 illustrates an example selector circuit 700 to receive an input from a user to indicate how to adjust a phase of a signal. The circuit 700 includes a switch 702 that a user may use to adjust the phase of a signal. A user may sweep across the entire spectrum of phases to adjust the signal. The switch 702 outputs to counters 704 and 706, which count rotations of the switch 702. The counters 704 and 706 output bits D0-D7, which are received by the circuit 400 of FIG. 4, the circuit 500 of FIG. 5 and the circuit 600 of FIG. 6, for example.

The switch 702 may output 64 pulses per rotation, and thus 256 pulses per 4 rotations, which are counted by the counters 704 and 706 and converted into a binary number or bits D0-D7. The pulses may be different for each direction, and one direction causes the counters 704 and 706 to count upward and the other direction causes the counters 704 and 706 to count downward. As described above, the two most significant bits (D6 and D7) can be used to establish within which quadrant to adjust the phase, and the remaining bits (D0-D5) can be used to determine where in the quadrant to adjust the phase. If all of D0-D5 are zero, then the phase is adjusted to be exactly on an axis. Example outputs of the counters 704 and 706 and the corresponding quadrants are shown below in Table 3. Of course, other bit mappings may be used as well.

TABLE 4

| |
|---|
| Northeast Quadrant: D7 = 0, D6 = 0 |
| Northwest Quadrant: D7 = 0, D6 = 1 |
| Southwest Quadrant: D7 = 1, D6 = 0 |
| Southeast Quadrant: D7 = 1, D6 = 1 |
| Due East: D7 = 0, D6 = 0, D5 = D4 = D3 = D2 = D1 = D0 = 0 |
| Due North: D7 = 0, D6 = 1, D5 = D4 = D3 = D2 = D1 = D0 = 0 |
| Due West: D7 = 1, D6 = 0, D5 = D4 = D3 = D2 = D1 = D0 = 0 |
| Due South: D7 = 1, D6 = 1, D5 = D4 = D3 = D2 = D1 = D0 = 0 |

Figure 8:
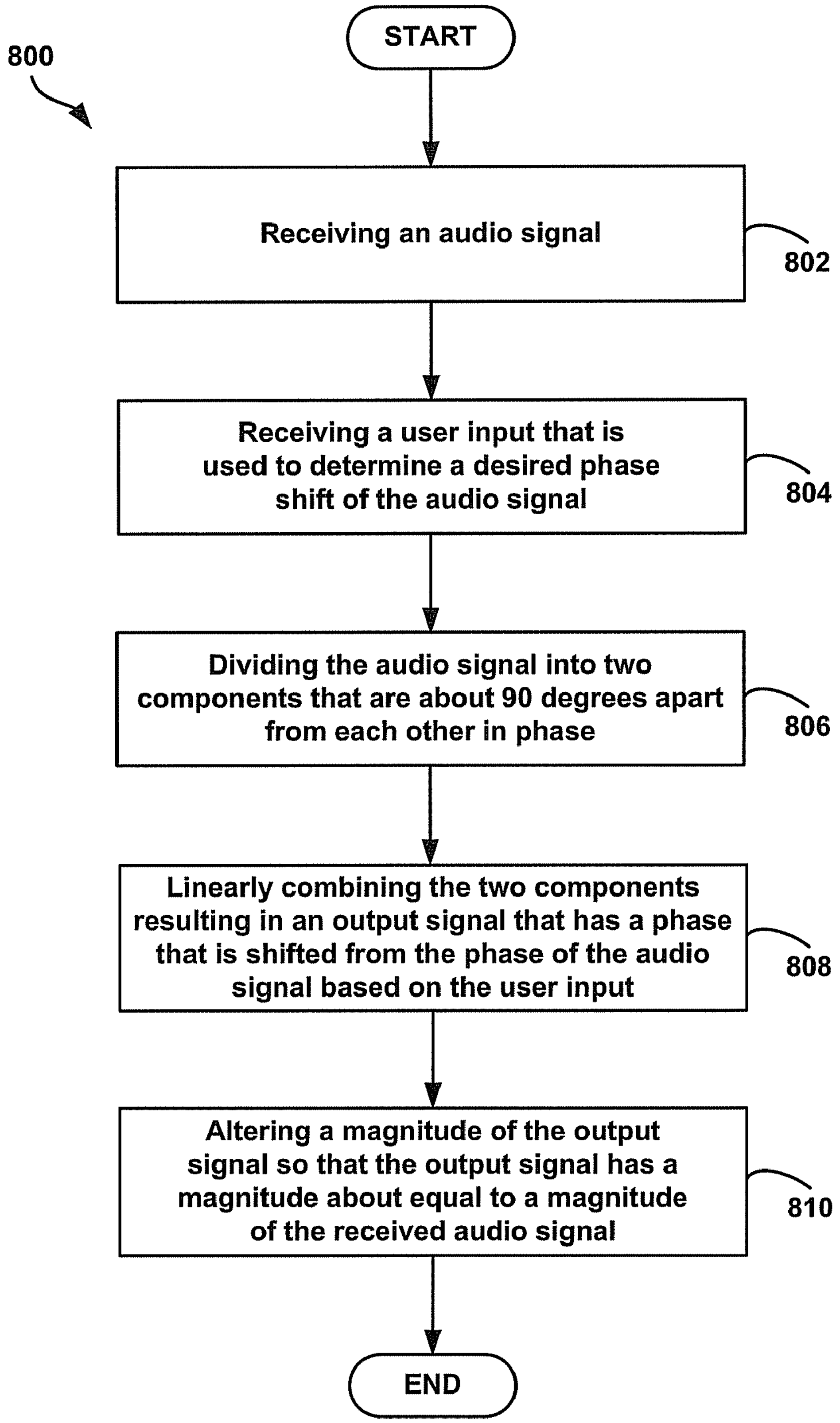
FIG. 8 illustrates an example flowchart including example functional steps for performing audio signal processing.

FIG. 8 illustrates an example flowchart including example functional steps 800 for performing audio signal processing. It should be understood that the flowchart shows the functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Initially, as shown at block 802, an audio signal is received, such as for example, from a microphone. Next, a user input is received that is used to determine a desired phase shift of the signal, as shown at block 804. The signal may then be divided into two components, and each component is about 90° apart from each other in phase, as shown at block 806. For example, the signal may be fed through a Hilbert transform filter-pair to create the two components. Prior to or after dividing the audio signal, a corrective delay may be introduced into the audio signal to correct for any delay that is introduced by the Hilbert transform filtering.

As shown at block 808, the two components of the audio signal are then linearly combined resulting in an output signal that has a phase that is shifted from the phase of the audio signal based on a value determined from the user input. Alternatively, or in addition, a compliment of each of the two components may be generated, and a linear combination of two signals selected from the two components and their compliments can be made to allow for an adjustment of the phase of the audio signal from about 0° to about 360°. A selection of which of the four signals to combine is made based on the user input. Further, based on the user input, a determination is made as to what percentage of each of the two selected signals is used in the linear combination.

Lastly, as shown at block 810, a magnitude of the output signal is altered so that the output signal has a magnitude about equal to a magnitude of the received audio signal. The magnitude may not need to be altered, and in such an instance, step 810 can be ignored, or when step 810 is performed, no change will be made to the magnitude of the output signal. The magnitude may not need to be altered in an instance in which the linear combination of two signals resulted in an output signal that has a magnitude equal to or about equal to the magnitude of the received audio signal. The magnitude of the output signal is altered by multiplying the output signal by a weight value selected or generated based on the input from the user. The weight value is generated by passing a portion of the user input through exclusive-or circuitry, and the weight value is made equal to the portion of the user input for all values of the input from zero to a mid-point value, and the weight value decreases from the mid-point value to zero in a sequential manner as values of the input increase beyond the mid-point value. Other manners of creating the weight values may be used as well, such as by performing alternative post-processing of the output signal to compare the magnitude of the output signal to the magnitude of the received audio signal, and further to apply a corrective weight value determined from the comparison so as to change the magnitude of the output signal to be substantially equal to the magnitude of the received audio signal.

In general, it should be understood that the circuits described herein may be implemented in hardware using integrated circuit development technologies, or yet via some other methods, or the combination of hardware and software objects that could be ordered, parameterized, and connected in a software environment to implement different functions described herein. For example, the present application may be implemented using a general purpose or dedicated processor running a software application through volatile or non-volatile memory. Also, the hardware objects could communicate using electrical signals, with states of the signals representing different data.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

While the application has been described in conjunction with examples, persons of skill in the art will appreciate that variations may be made without departure from the scope and spirit of the invention. The true scope and spirit of the invention is defined by the appended claims, which may be interpreted in light of the foregoing.

What is claimed is:

1. A system comprising:

a delay equalization filter for receiving an audio signal and introducing a compensating delay into the audio signal;

a Hilbert transform filter-pair for receiving the audio signal from the delay equalization filter and outputting two signal components, the two signal components being about 90° apart from each other in phase;

one or more inverters for inverting one or both of the two signal components; and a summing circuit for performing linear combinations of two signals selected from the group of the two signal components and compliments of the two signal components, so as to allow for a phase of the audio signal to be shifted from about 0° to about 360° .

2. The system of claim 1, wherein the Hilbert transform filter-pair outputs two signal components being about 90° apart from each other in phase for all frequencies of the audio signal.

3. The system of claim 1, wherein the delay equalization filter comprises multiple stages of second order filters that introduce the compensating delay into the audio signal, wherein the compensating delay is constant.

4. The system of claim 1, further comprising a gain adjustment circuit to alter a magnitude of a signal output from the summing circuit, so that the signal output from the summing circuit has a magnitude about equal to a magnitude of the received audio signal.

5. The system of claim 1, further comprising a phase selector to determine how to perform the linear combinations of the two signals based on an input from a user.

6. The system of claim 5, further comprising input circuitry to receive the input from the user.

7. The system of claim 5, wherein the summing circuit performs the linear combinations of the two signals according to the following equation:

$$V_{out}=\alpha V_{(2)}+(1-\alpha)V_{(2)}$$

where $V_{(1)}$ is one of the signals, $V_{(2)}$ is the other signal and a is a constant, wherein the constant is determined from the input from the user.

8. The system of claim 7, further comprising a gain adjustment circuit to alter a magnitude of a signal output from the summing circuit by multiplying the output signal $V_{out}$ by a weight value selected based on the input from the user.

9. The system of claim 8, wherein the gain adjustment circuit includes exclusive-or circuitry that receives a portion of the input from the user and outputs the weight value.

10. The system of claim 9, wherein the weight value is equal to the portion of the input from the user for all values of the input from zero to a mid-point value, and wherein the weight value decreases from the mid-point value to zero in a sequential manner as values of the input from the user increase beyond the mid-point value, wherein the input from the user has a maximum value and wherein the mid-point value is about half of the maximum value in power.

11. The system of claim 1, further comprising a display circuit to provide a visual display that graphically illustrates an adjustment to the phase of the audio signal.

12. A method of adjusting a phase of an audio signal comprising:

receiving an audio signal;

receiving an input from a user that is used to determine a phase shift to a phase of the audio signal to achieve a desired degree of loudness of the audio signal;

splitting the audio signal into a first signal and a second signal such that a phase of the first signal is about 90° apart from a phase of the second signal; and allowing for adjustment of the phase of the audio signal from about 0° to about 360° by linearly combining the first signal and the second signal resulting in an output signal that has a phase that is shifted from the phase of the audio signal by the determined phase shift.

13. The method of claim 12, wherein splitting the audio signal into a first signal and a second signal such that a phase of the first signal is about 90° apart from a phase of the second signal comprises performing a Hilbert Transform of the audio signal.

14. The method of claim 12, further comprising introducing a corrective delay into the audio signal prior to the audio signal being split.

15. The method of claim 12, further comprising introducing a corrective delay into each of the first signal and the second signal.

16. The method of claim 12, wherein linearly combining the first signal and the second signal is performed according to the equation:

$$V_{out}=\alpha V_{(1)}+(1-\alpha)V_{(2)}$$

where $V_{(1)}$ is the first signal, $V_{(2)}$ is the second signal and $\alpha$ is a parameter, wherein the parameter is determined from the input from the user.

17. The method of claim 16, further comprising altering a magnitude of the output signal $V_{out}$ so that the output signal has a magnitude about equal to a magnitude of the received audio signal.

18. The method of claim 16, further comprising converting the input from the user into a binary word, wherein a portion of the binary word is used to determine a quadrant within which adjustment of the phase will result, and wherein a portion of the binary word is used to determine increments of the adjustment of the phase within the quadrant.

19. The method of claim 18, wherein the parameter, $\alpha$, is the portion of the binary word used to determine increments of the adjustment of the phase within the quadrant.

20. The method of claim 16, further comprising multiplying the output signal $V_{out}$ by a weight value selected based on the input from the user.

21. The method of claim 20, further comprising generating the weight value by passing the parameter through exclusive or controlled circuitry, wherein the weight value is equal to the parameter for all values of the parameter from zero to a mid-point value, and wherein the weight value decreases from the mid-point value to zero in a sequential manner as values of the parameter increase beyond the mid-point value, wherein the parameter has a maximum value and wherein the mid-point power value is half of the maximum value.

22. The method of claim 12, further comprising providing a compliment of the first signal so as to produce a third signal, and providing a compliment of the second signal so as to produce a fourth signal.

23. The method of claim 22, wherein allowing for adjustment of the phase of the audio signal from about 0° to about 360° comprises linearly combining two signals selected from the group of the first signal, the second signal, the third signal, and the fourth signal resulting in an output signal that has a phase that is shifted from the phase of the audio signal by the determined phase shift.

24. The method of claim 12, wherein adjustment of the phase can occur within divisions of the 0° to 360° phase range, and the method further comprising converting the input from the user into a binary word, wherein a portion of the binary word is used to determine a division within which adjustment of the phase will result, and wherein a portion of the binary word is used to determine increments of the adjustment of the phase within the division.

* * * * *